United States Patent
Gupta et al.

(10) Patent No.: US 10,911,053 B2
(45) Date of Patent: Feb. 2, 2021

(54) PHASE LOCKED LOOP DESIGN WITH REDUCED VCO GAIN

(71) Applicant: STMicroelectronics International N.V., Schiphol (NL)

(72) Inventors: Nitin Gupta, Kurukshetra (IN); Kapil Kumar Tyagi, Greater Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/966,134

(22) Filed: Apr. 30, 2018

(65) Prior Publication Data
US 2019/0334530 A1    Oct. 31, 2019

(51) Int. Cl.
*H03L 7/085*    (2006.01)
*H03L 7/099*    (2006.01)

(52) U.S. Cl.
CPC .............. *H03L 7/085* (2013.01); *H03L 7/099* (2013.01)

(58) Field of Classification Search
CPC ................................ H03L 7/085; H03L 7/099
See application file for complete search history.

(56) References Cited

U.S. PATENT DOCUMENTS

| | | | | |
|---|---|---|---|---|
| 7,312,663 | B2 * | 12/2007 | Abel | H03L 7/093 327/156 |
| 8,154,350 | B2 * | 4/2012 | Faison | H03L 7/099 327/157 |
| 9,203,416 | B2 * | 12/2015 | Rozenblit | H03L 7/08 |
| 10,056,911 | B2 * | 8/2018 | Rombach | H03L 7/099 |
| 2012/0084378 | A1 * | 4/2012 | Kaneko | H04L 12/40019 709/208 |

* cited by examiner

*Primary Examiner* — Lincoln D Donovan
*Assistant Examiner* — Colleen J O Toole
(74) *Attorney, Agent, or Firm* — Crowe & Dunlevy

(57) ABSTRACT

A PLL includes a phase frequency detector (PFD) receiving an input signal and feedback signal, and producing a control signal. A charge pump receives the control signal and produces an initial VCO control. A loop filter generates a fine VCO control and intermediate output based upon the initial VCO control. A coarse control circuit includes an integrator having a first input receiving the intermediate output, a second input, and generating a coarse VCO control, a first switch coupling a reference voltage to the second input, a buffer buffering output of the integrator, and a second switch coupling output of the integrator to the second input of the integrator. A VCO receives the fine VCO control and the coarse VCO control, and generates an output signal having a frequency based thereupon. A feedback path receives the output signal and produces the feedback signal.

11 Claims, 4 Drawing Sheets

PHASE LOCKED LOOP DESIGN WITH REDUCED VCO GAIN

TECHNICAL FIELD

This disclosure relates to locked loop circuits and, in particular, to a phase locked loop (PLL) design that reduces the gain of its voltage controlled oscillator (VCO) through the use of fine and coarse controls.

BACKGROUND

Locked loop circuits, such as phase locked loop circuits, are basic components of radio, wireless, and telecommunication technologies. A phase locked loop (PLL) is a control system that generates an output signal having a phase related to the phase of an input signal. A simple PLL includes a variable frequency oscillator and a phase detector. The oscillator generates a periodic signal, and the phase detector compares the phase of that periodic signal with the phase of a reference periodic signal, adjusting the oscillator to keep the phases matched. Keeping the input and output phase in lock step may also imply keeping the input and output frequencies the same. Consequently, in addition to synchronizing signals, a PLL can track an input frequency, or it can generate a frequency that is a multiple (or fraction) of the input frequency.

A commonly used variable frequency oscillator is a ring type voltage controlled oscillator (VCO). Ring type VCOs, however, have a high gain, leading to high noise resulting from resistors in filter elements of the PLL. To reduce the gain of a ring oscillator VCO, one known approach is to utilize a bias current to provide a constant current into the ring oscillator VCO, thereby reducing its gain. The ring oscillator VCO must, however, remain capable of compensating for the temperature and aging of its components, resulting in a limitation of the reduction of the gain of the ring oscillator VCO to a factor of about one half. Since it may be desirable to reduce the gain of the ring oscillator VCO by more than one half, this known approach is unsuitable for some applications.

Another known approach is now described with reference to the circuit shown in FIG. 1. Here, the phase locked loop 100 includes a phase frequency detector (PFD) 102 that compares an input signal Fref to a feedback signal Fdiv, and produces error signals UP1, DN1 which are based upon the phase difference between the input signal Fref and feedback signal Fdiv. When the phase of the input signal Fin leads the phase of the feedback signal Fdiv, the control signal UP1 is asserted at a logic high, while the control signal DN1 remains at a logic low. Conversely, then when the phase is the input signal Fin lags the phase of the feedback signal Fdiv, the control signal DN1 is asserted at a logic high, while the control signal UP1 remains at a logic low. When the phase of the input signal Fin and the phase of the feedback signal Fdiv match, neither UP1 nor DN1 are asserted. Since the phase of the input signal Fin cannot both lead and lag the phase of the feedback signal Fdiv, the phase frequency detector PFD will not simultaneously assert both UP1 and DN1.

A charge pump 104 receives the control signals UP1, DN1 and generates differential control signals UP2, DN2 for the VCO based upon the control signals UP1, DN1. When UP1 is asserted, the charge pump increases the voltage difference between the differential control signals UP2, DN2, as opposed to decreasing the voltage difference between the differential control signals UP2, DN2 when DN1 is asserted.

The differential control signals UP2, DN2 are then low pass filtered by a filter 106 to produce "fine" control signals Vfinep and Vfinen for controlling a voltage controller oscillator (VCO) 110 in a fine range. A coarse control block 108 receives the fine control signals Vfinep and Vfinen, as well as reference signals Vrefp and Vrefn, and based thereupon, generates a "coarse" control signal Vcoarse for controlling the VCO 110 in a coarse range. Adjustment of the fine range changes the coarse range. Further details of the coarse control block 108 will be given below.

The fine control signals Vfinep, Vfinen and the coarse control signal Vcoarse drive the VCO 110 which creates an output signal having a phase and frequency based upon the fine control signals Vfinep, Vfinen and the coarse control signal Vcoarse. The output signal is fed through a divider 114 back to the input of the PFD 102 as the feedback signal Fdiv, producing a negative feedback loop. If the output phase drifts, control signals UP2, DN2 will change accordingly, driving the phase of the VCO 110 in the opposite direction so as to reduce the error. Thus the output phase of the output signal of the VCO 110 is locked to the phase of the input signal Fref. The output signal from the VCO 110 is fed through a second divider 112 to produce an output signal Fout locked in phase to the input signal Fref.

The coarse control block 108 is now described with additional reference to FIG. 2. The coarse control block 108 includes: a first differential pair of transistors MP1, MP2 that determines (1) the difference between Vrefn and Vfinen; a second differential pair of transistors MP3, MP4 that determines (2) the difference between Vrefp and Vfinep; and a third differential pair of transistors MN1, MN2 that determines the difference between the differences (1) and (2). The output current representing this third difference is mirrored to switch SW1 through transistors MN2, MN4, as well as MN1, MN3, MP5, MP6.

The switch SW1 is periodically closed. Closing of the switch SW1 transfers the output current to a single ended capacitor C, which sets the voltage at a gate of an output source follower transistor MP7. This serves to periodically integrate the fine control signals Vfinen, Vfinep which in conjunction with the operation of the PLL, reduces the difference between fine control signals Vfinep, Vfinen, and reference signals Vrefp, Vrefn, effectively centering the fine input range about reference signals Vrefp, Vrefn. Thus, the effective range of fine control signals Vfinep, Vfinen is dynamically maximized.

When switch SW1 is opened, switch SW2 is closed, integration of the fine control signals Vfinep, Vfinen ceases and a buffer 116 applies the voltage of the single ended capacitor C to the output node of SW2. This maintains readiness of the coarse control block 108 when integration resumes.

The PLL 100 in conjunction with the coarse control block 108 is capable of adjusting for temperature change and aging effects, and reduces the gain of the VCO 110. However, the gain reduction of this approach is also limited because the Vcoarse and Vfinep, Vfinen voltages are at different potentials leading to vastly different transconductances inside the voltage to current converter inside the VCO 110, limiting the reduction in VCO gain across PVT variation. This is not sufficient for low voltage applications, since the VCO gain is high for low voltage ring oscillator based PLLs.

Therefore, further development into PLL circuits that reduce the gain of their VCOs is needed.

SUMMARY

Disclosed herein is a phase locked loop including a phase frequency detector (PFD) receiving an input signal and a feedback signal, and producing a control signal based upon a phase comparison thereof. A charge pump receives the control signal from the PFD and produces an initial voltage controller oscillator (VCO) control signal based thereupon. A loop filter generates a fine VCO control signal and an intermediate output signal, based upon the initial VCO control signal.

A coarse control circuit is configured to, in a first phase, integrate a difference between the intermediate output signal and a reference voltage to thereby generate a coarse VCO control signal centered about the intermediate output signal. In a second phase, the coarse control circuit integrates a difference between the intermediate output signal and a buffered feedback signal to thereby generate the coarse VCO control signal as centered about the intermediate output signal. Here, the buffered feedback signal is a buffered version of the coarse VCO control signal. A VCO receives as input the fine VCO control signal and the coarse VCO control signal, and generates an output signal having a frequency based upon the fine VCO control signal and the coarse VCO control signal. A feedback path is coupled to the VCO to receive the output signal and produce the feedback signal.

The feedback path may include a divider coupled to the output of the VCO, generating the feedback signal, and coupled to the PFD to provide the feedback signal thereto.

The loop filter may include a resistor and capacitor coupled in series between an output of the charge pump and ground. The fine VCO control signal may be generated at an upper tap of the loop filter, and the intermediate output signal may be generated at a center tap of the loop filter.

DETAILED DESCRIPTION

Figure 1:
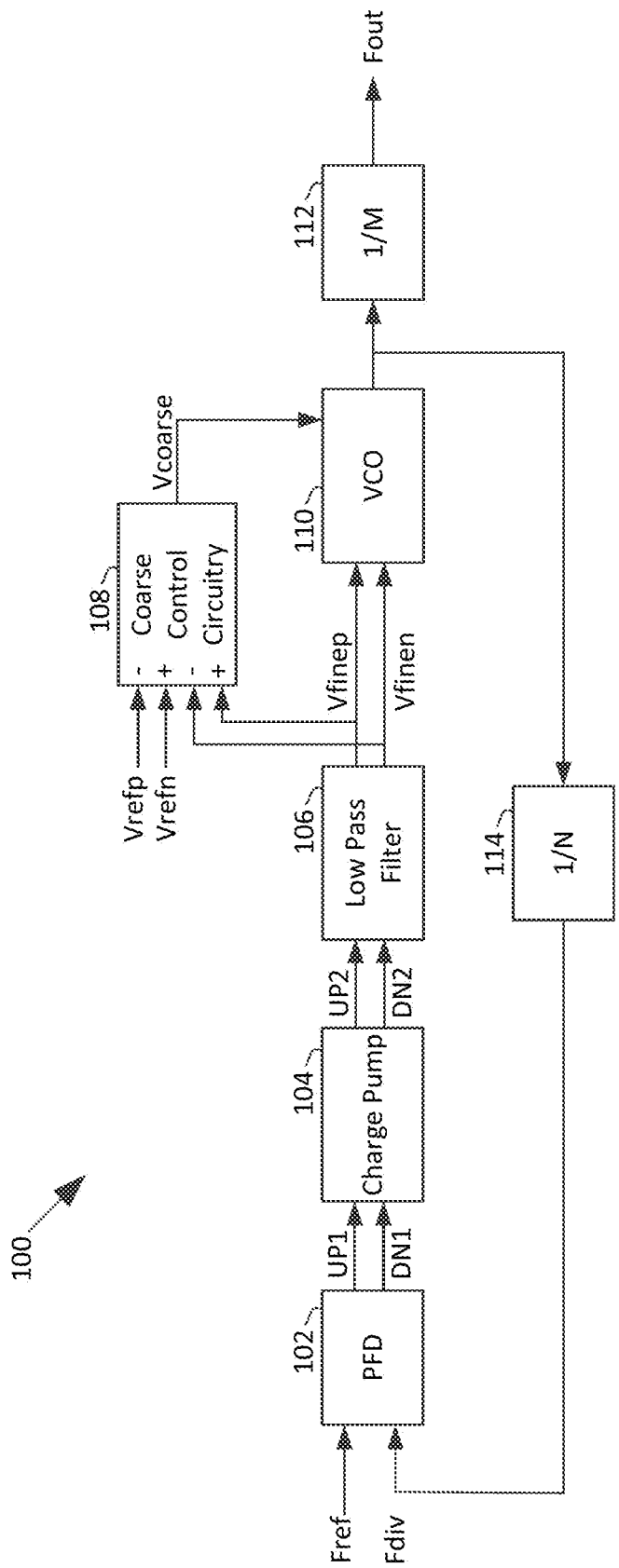
FIG. 1 is a block diagram of a phase locked loop including a VCO controlled in a coarse range and a fine range, so as to reduce the VCO gain, in accordance with the prior art.
Figure 2:
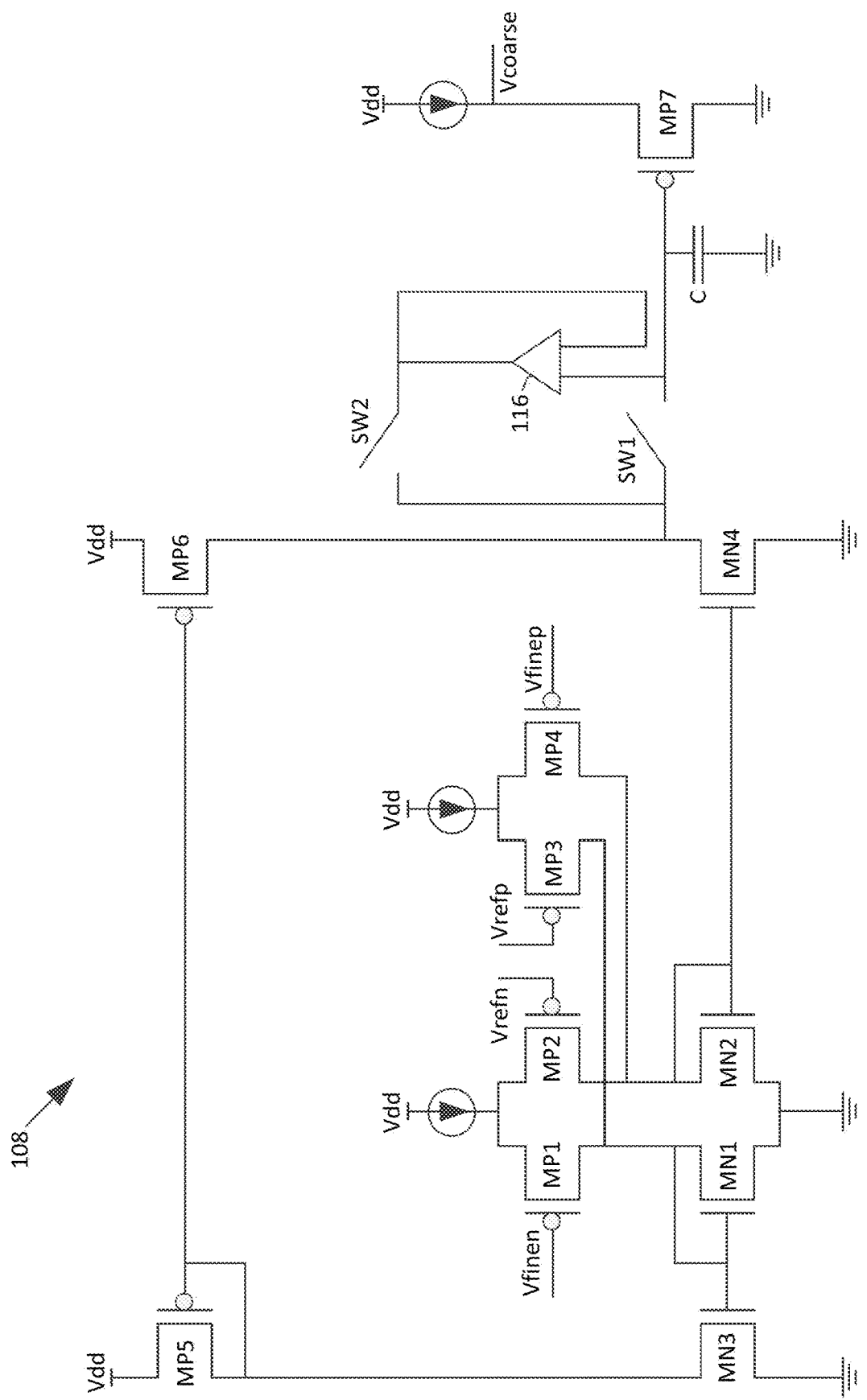
FIG. 2 is a block diagram of the coarse control block of FIG. 1, in accordance with the prior art.
Figure 3:
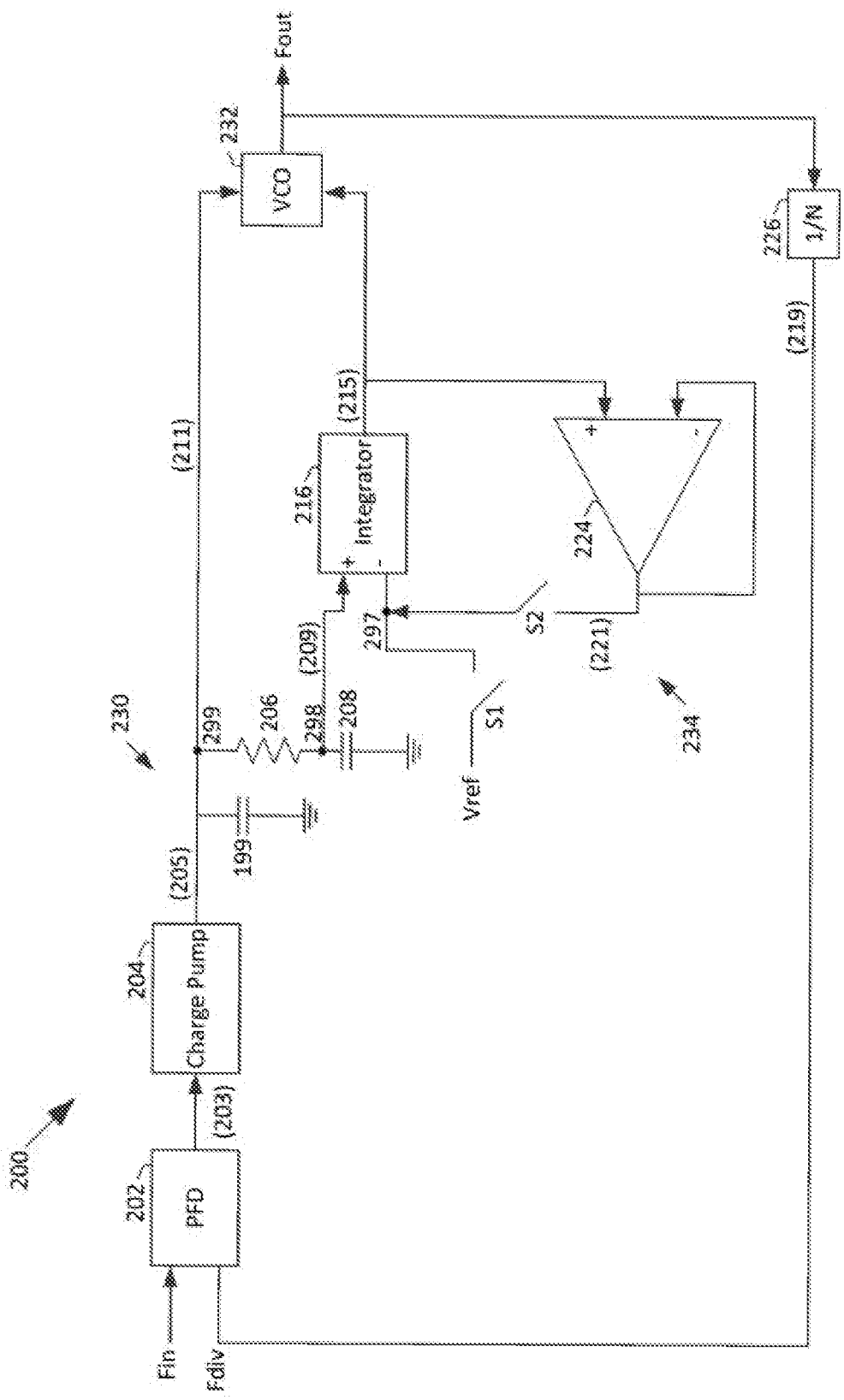
FIG. 3 is a block diagram of a phase locked loop including a VCO controlled in a coarse range and a fine range, so as to reduce the VCO gain, in accordance with this disclosure.

Shown in FIG. 3 is a phase locked loop (PLL) 200. A phase frequency detector (PFD) 202 compares an input signal Fref and feedback signal Fdiv, and produces an error signal 203 which is proportional to the phase difference between the input signal Fref and feedback signal Fdiv. A charge pump 204 generates a control signal 205 for the VCO 232 based upon the control signal 203. When the phase of the input signal Fin leads the phase of the feedback signal Fdiv, the charge pump 204 increases the voltage of the control signal 205, as opposed to decreasing the voltage of the control signal 205 when the phase of the feedback signal Fdiv leads the phase of the input signal Fin.

The control signal 205 is passed to the filter 230. Any type of filter may be used 239, although as an example, the filter 230 is depicted as being comprised of a resistive component 206, and capacitive components 199 and 208, illustratively shown as a resistor and capacitors. The resistor 206 and capacitor 208 are coupled in series between node 299 and ground to form a series RC filter. The capacitor 199 is coupled between node 299 and ground. A fine control signal 211 for the VCO 232 is produced at node 299.

The center tap 298 of the filter 230 produces an intermediate signal 209. An integrator 216 has a non-inverting input receiving the intermediate signal 209, and an inverting input coupled to node 297. A switch S1 selectively couples the node 297 to a reference voltage Vref, and a switch S2 selectively couples the node 297 to receive a buffered feedback signal 221. A coarse control signal 215 for the VCO 232 is produced at the output of the integrator 216.

The VCO 232 receives both the fine control signal 211 and the coarse control signal 215. As should be appreciated, the fine control signal 211 is for controlling the VCO 232 in a fine range, and the coarse control signal 215 is for controlling the VCO 232 in a coarse range.

A buffer 224 (operational amplifier in a unity gain configuration) is coupled between the output of the integrator 216 and switch S2, and therefore serves to buffer the coarse control signal 215 to switch S2 as the buffered feedback signal 221. The use of the buffer 224 helps reduce power overhead of the PLL 200 because its power overhead is low, as the bandwidth of the feedback path through the buffer 224 is low (lower than even the integrator 216). Thus, the power utilized by the buffer 244 is so low as to be negligible in terms of overall power consumption of the PLL 200.

In operation, in a first phase, after the PLL 299 is awakened from a powered down condition and is thus unlocked, switch S1 is closed and switch S2 is opened so that the inverting input of the integrator 216 sees Vref at its input. When switch S1 is closed, the fine control signal 211 and the coarse control signal 215 are at different potentials, feeding current into the VCO 232 to produce the desired output Fout.

When the frequency of Fout locks, switch S1 is opened and switch S2 is closed, beginning a second phase. In this pase, through the buffer 224, eventually the fine control signal 211 and the coarse control signal 215 will be close in potential, leading to similar characteristics for the voltage to current converter inside the VCO 232 for coarse and fine paths. The integrator 216 brings the intermediate signal 209 and the buffered feedback signal 221 (at its inputs) to approximately the same potential, while the buffer 224 ensures that the buffered feedback signal 221 and the coarse control signal 215 are at approximately the same potential. Thus, as stated, the buffered feedback signal 221 and the coarse control signal 215 are approximately at the same potential (or, stated another way, the coarse control signal 215 is centered about the buffered feedback signal 221 or centered about the intermediate signal 209), which was not the case in conventional designs, and which leads to the same transconductance of the voltage to current converter inside VCO 232 for both coarse and fine inputs. This allows the increase of the amount of gain reduction of the VCO 232 by a much larger amount than possible with conventional designs.

The output signal Fout is fed through a divider 226 back to the input of the system as the feedback signal Fdiv, producing a negative feedback loop. If the output phase drifts, the control signal 205 will change accordingly, driving the VCO 232 phase in the opposite direction so as to reduce the error. Thus the output phase at the output of the VCO 232 is locked to the phase of the input signal Fref.

There are additional benefits to the PLL 200 design other than reduced gain of the VCO 232. Due to the reduced gain of the VCO 232, noise introduced by the resistor 206 of the loop filter 230 is reduced to an insignificant level. In addition, also due to the reduced gain of the VCO 232, the current output by the charge pump 204 can be kept high, helping to reduce the noise output by the charge pump 204. In addition, this design of the PLL 200 reduces the range of control voltages to the VCO 232 across PVT differences, allowing the PLL 200 itself to have a lower supply voltage, and simplifying the design of the charge pump 204.

Figure 4:
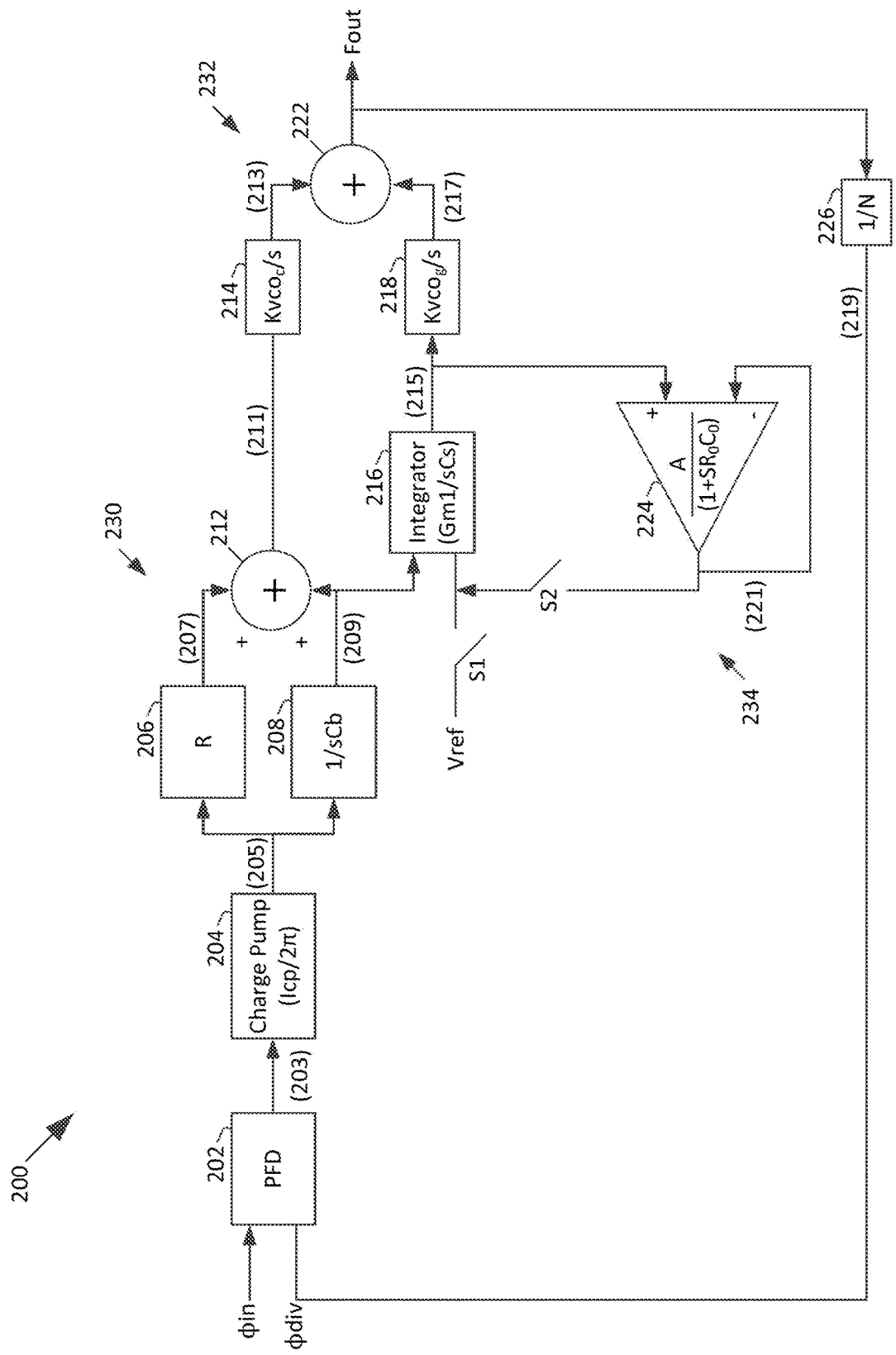
FIG. 4 is a block diagram of the phase locked loop of FIG. 3, drawn in the Laplace domain.

Depicted in FIG. 4 is the PLL 200 in the Laplace domain. This depiction is helpful to understand the transfer function of the filter 230, as well as the overall transfer function of the PLL 200. As can be seen in FIG. 4, the charge pump 204 has a gain of Icp/2π (where Icp=charge pump current). As can also be seen in FIG. 4, the operational amplifier 224 has a transfer function of $A/(1+SR_0C_0)$. In addition, the resistive component 206 of the filter 230 is represented by a value R, and the capacitive component 208 is represented by a value 1/sCb (neglecting the capacitor 199 shown in FIG. 3 for ease of representation). The output 207 of the resistive component 206 and output 209 of the capacitive component 208 can be considered to be summed by a summer 212 to provide the fine control signal 211 for the VCO 232. Thus, it can be seen that the filter 230 provides the PLL 200 with a high loop gain at low frequency, and a left half plane zero at wz=1/RCb. The bandwidth of the PLL 200 is high, therefore, the fact that the feedback for the integrator 216 has a lower bandwidth (Gm1/sCs) than the PLL 200 itself does not negatively impact stability.

The VCO 232 is represented by amplification block 214 that amplifies the fine control signal 211 by a factor equal to $Kvcoc_c/s$ to produce signal 213, and amplification block 218 which amplifies the coarse control signal 215 by a factor equal to $Kvcoc_g/s$ to produce signal 217. The signals 213 and 217 can be considered to be summed by summer 222, and thus, it can be appreciated that the VCO 232 responds to the fine control signal 211 with a gain of $Kvcoc_c/s$, and responds to the coarse control signal 215 with a gain of $Kvcoc_g/s$.

The overall transfer function of the PLL has a constant low frequency gain to a corner frequency determined by the resistive component 206 and capacitive component 208 of the filter 230, then falls off with two poles on roll off. One pole is defined by the capacitive component 208 and is at sCb, and the other pole is defined by the transfer function of the operational amplifier 224, and is $SR_0C_0$. Thus, the gain control provided by the coarse control signal 215 is around 20 to 30 times that provided by the fine control signal 211.

The invention claimed is:

1. A phase locked loop, comprising:
 a phase frequency detector (PFD) having a first input terminal receiving an input signal and a second input terminal receiving a feedback signal;
 a charge pump having an input terminal coupled to an output terminal of the PFD;
 a loop filter comprising a resistor and a capacitor in series between an output terminal of the charge pump and ground;
 an integrator having a non-inverting terminal coupled to a center tap of the loop filter;
 a first switch coupled between a reference voltage and an inverting terminal of the integrator;
 a second switch coupled to the inverting terminal of the integrator;
 a buffer amplifier coupled between an output terminal of the integrator and the second switch, wherein the buffer amplifier comprises an operational amplifier in a unity gain configuration;
 a voltage controlled oscillator (VCO) having a first input terminal coupled to the loop filter and a second input terminal coupled to the output terminal of the integrator; and
 a feedback path providing the feedback signal.

2. The phase locked loop of claim 1, wherein the feedback path comprises a divider coupled between an output of the VCO and the second input terminal of the PFD.

3. A phase locked loop, comprising:
 a phase frequency detector (PFD) receiving an input signal and a feedback signal, and producing a control signal based upon a phase comparison thereof;
 a charge pump receiving the control signal from the PFD and producing an initial voltage controller oscillator (VCO) control signal based thereupon;
 a loop filter generating a fine VCO control signal and an intermediate output signal, based upon the initial VCO control signal;
 a coarse control circuit comprising:
  an integrator having a first input receiving the intermediate output signal from the loop filter and generating a coarse VCO control signal;
  a first switch selectively coupling a reference voltage to a second input of the integrator;
  a buffer amplifier buffering output of the integrator, wherein the buffer amplifier comprises an operational amplifier in a unity gain configuration; and
  a second switch selectively coupling output of the integrator to the second input of the integrator;
 a VCO receiving as input the fine VCO control signal and the coarse VCO control signal, and generating an output signal having a frequency based upon the fine VCO control signal and the coarse VCO control signal; and
 a feedback path coupled to the VCO to receive the output signal and produce the feedback signal.

4. The phase locked loop of claim 3, wherein the feedback path comprises a divider coupled to an output of the VCO, generating the feedback signal, and coupled to the PFD to provide the feedback signal thereto.

5. The phase locked loop of claim 3, wherein the loop filter comprises a resistor and capacitor coupled in series between an output of the charge pump and ground;
 wherein the fine VCO control signal is generated at an upper tap of the loop filter; and wherein the intermediate output signal is generated at a center tap of the loop filter.

6. A phase locked loop, comprising:
 a phase frequency detector (PFD) receiving an input signal and a feedback signal, and producing a control signal based upon a phase comparison thereof;
 a charge pump receiving the control signal from the PFD and producing an initial voltage controller oscillator (VCO) control signal based thereupon;
 a loop filter generating a fine VCO control signal and an intermediate output signal, based upon the initial VCO control signal;
 a coarse control circuit configured to:
  integrate a difference between the intermediate output signal and a reference voltage to thereby generate a coarse VCO control signal centered about the intermediate output signal, in a first phase; and
  integrate a difference between the intermediate output signal and a buffered feedback signal to thereby generate the coarse VCO control signal as centered about the intermediate output signal, in a second phase, wherein the buffered feedback signal comprises a buffered version of the coarse VCO control signal produced by a buffer amplifier, wherein the buffer amplifier comprises an operational amplifier in a unity gain configuration;

a VCO receiving as input the fine VCO control signal and the coarse VCO control signal, and generating an output signal having a frequency based upon the fine VCO control signal and the coarse VCO control signal; and a feedback path coupled to the VCO to receive the output signal and produce the feedback signal.

7. The phase locked loop of claim 6, wherein the feedback path comprises a divider coupled to an output of the VCO, generating the feedback signal, and coupled to the PFD to provide the feedback signal thereto.

8. The phase locked loop of claim 6, wherein the loop filter comprises a resistor and capacitor coupled in series between an output of the charge pump and ground;

wherein the fine VCO control signal is generated at an upper tap of the loop filter; and wherein the intermediate output signal is generated at a center tap of the loop filter.

9. A control circuit for a phase locked loop, the control circuit comprising:

a loop filter generating a fine VCO control signal and an intermediate output signal, based upon a received initial VCO control signal; and a coarse control circuit comprising:

an integrator having a first input receiving the intermediate output signal from the loop filter and generating a coarse VCO control signal;

a first switch selectively coupling a reference voltage to a second input of the integrator;

a buffer amplifier buffering output of the integrator, wherein the buffer amplifier comprises an operational amplifier in a unity gain configuration; and a second switch selectively coupling output of the integrator to the second input of the integrator.

10. The phase locked loop of claim 9, wherein the loop filter comprises a resistor and capacitor coupled in series; wherein the fine VCO control signal is generated at an upper tap of the loop filter; and wherein the intermediate output signal is generated at a center tap of the loop filter.

11. A control circuit for a phase locked loop, the control circuit comprising:

a filter comprising a resistor and a capacitor in series between a node and ground;

an integrator having a non-inverting terminal coupled to a center tap of the filter;

a first switch coupled between a reference voltage and an inverting terminal of the integrator;

a second switch coupled to the inverting terminal of the integrator; and a buffer amplifier coupled between an output terminal of the integrator and the second switch, wherein the buffer amplifier comprises an operational amplifier in a unity gain configuration.

* * * * *